United States Patent [19]

Okanobu

[11] Patent Number: 4,739,517
[45] Date of Patent: Apr. 19, 1988

[54] AUTODYNE RECEIVER

[75] Inventor: Taiwa Okanobu, Tokyo, Japan

[73] Assignee: Sony Corporation, Tokyo, Japan

[21] Appl. No.: 831,282

[22] Filed: Feb. 20, 1986

[30] Foreign Application Priority Data

Feb. 26, 1985 [JP] Japan ................. 60-36791

[51] Int. Cl.⁴ .............................................. H04B 1/26
[52] U.S. Cl. .................................. 455/321; 455/193; 455/197; 455/340
[58] Field of Search ............... 455/193, 197, 200, 266, 455/286, 291, 321, 336, 340

[56] References Cited

U.S. PATENT DOCUMENTS

| 3,528,014 | 9/1970 | Albee | 455/193 |
| 3,824,473 | 7/1974 | Pye | 455/291 |
| 3,953,799 | 4/1976 | Albee | 455/291 |
| 4,442,434 | 4/1984 | Baekgaard | 455/291 |

FOREIGN PATENT DOCUMENTS

| 428285 | 10/1932 | United Kingdom . |
| 688013 | 7/1953 | United Kingdom . |
| 820008 | 1/1956 | United Kingdom . |
| 1073071 | 12/1963 | United Kingdom . |

Primary Examiner—Michael A. Masinick
Attorney, Agent, or Firm—Ronald P. Kananen

[57] ABSTRACT

An autodyne receiver comprises a plurality of tuning circuits for tuning a high frequency signal in linkage motion thereof and, in particular, a negative impedance converter connected to at least one of the tuning circuits to cancel apparent parallel resistance of the tuning circuit. Since the resistance of the tuning circuit is cancelled, the sharpness of the tuning circuit can be improved, thus allowing the use of a stable tuning circuit having a low sharpness without use of positive feedback. The gain of the negative impedance converter is constant irrespective of signal frequency and the tuning sharpness increases in proportion to signal frequency. Thus, the selectivity of the receiver is constant irrespective of received signal frequency.

14 Claims, 1 Drawing Sheet

AUTODYNE RECEIVER

BACKGROUND OF THE INVENTION

1. Field of the Invention

The present invention relates generally to an autodyne receiver, and more particularly to a tuning circuit incorporated in the autodyne receiver. Still more particularly, this invention relates to a tuning circuit for an autodyne receiver which includes a negative resistive impedance converter to cancel the resistive impedance of the tuning circuit to improve the tuning characteristics of the receiver.

2. Description of the Prior Art

In a superheterodyne receiver, it is possible to improve the selectivity by reducing the intermediate frequency of received signals. On the other hand, since the superheterodyne receiver is subjected to image interference, the lower the intermediate frequency, the greater the image interference. In addition, non-uniform sensitivity often occurs within the reception band due to tracking error. Further, there exist such drawbacks that the number of necessary circuit elements is great and the adjustment positions are many after the superheterodyne receiver has been assembled.

In contrast with this, autodyne receivers do not suffer from the above problems involved in the superheterodyne receiver. Further, there has been proposed an autodyne receiver such that a positive feedback is applied to a tuning circuit connected at a previous stage of the detector to increase the tuning sharpness Q of the tuning circut, that is, to obtain a higher selectivity and a higher high-frequency gain.

In general, the tuning sharpness Q of a tuning circuit can be expressed as $$Q = fo/\Delta f$$

where fo denotes a center frequency of the band of passed signals of a tuning circuit, and $\Delta f$ denotes a bandwidth corresponding to $-3$ db response from top at the center frequency fo (see FIG. 4). The above expression indicates that in the autodyne receiver, the higher the tuning sharpness Q, the narrower the bandwidth $\Delta f$ at the center frequency fo so that the selectivity of the autodyne receiver will be improved. In addition, the high-frequency gain of the receiver can be increased under positive feedback control.

However, there inevitably exists a limit in applying a positive feedback signal to a high frequency signal tuning circuit because oscillation is readily generated. Therefore, it is difficult to obtain a sufficiently high selectivity and a high high-frequency gain simultaneously in a high frequency tuning circuit. Furthermore, it is difficult to apply an automatic gain control (AGC) signal to the tuning circuit because of its lack of gain. On the other hand, the positive feedback control inevitably results in instability in the tuning circuit.

To overcome the above-mentioned problems involved in the autodyne receiver, there has been proposed another autodyne receiver such that a Q multiplier is connected to an antenna tuning circuit to increase the tuning sharpness Q of the antenna circuit to improve the selectivity thereof. In the autodyne receiver of this type, however, there still exist problems in that the design of the tuning circuit is very severe and further oscillation is often generated when the selectivity is increased, thus involving problems similar to those of the conventional autodyne receiver with respect to the selectivity and stability since each is contrary to the other.

Further, in the case where the medium wave band is from 535 to 1605 kHz, the bandwidth $\Delta f$ at the highest reception frequency is about three times wider than that at the lowest reception frequency in accordance with the above expression, thus resulting in another problem in that the selectivity changes markedly according to the magnitude of reception frequency.

Thus it is a continuing problem in the art of providing autodyne receivers to improve the stability of the tuning circuit for the receiver to exhibit high selectivity while maintaining stability, increase its tuning sharpness, and exhibit uniform sensitivity over the frequency range of interest for the receiver.

SUMMARY OF THE INVENTION

With these problems in mind, therefore, it is the primary object of the present invention to provide an autodyne receiver having a high selectivity without deteriorating the stability of the receiver.

It is another object of the present invention to provide an autodyne receiver having a high uniform sensitivity irrespective of its received signal frequency.

It is another object of the present invention to provide an autodyne receiver having a high tuning sharpness proportional to its received signal frequency.

It is still another object of the present invention to provide an autodyne receiver having a constant gain irrespective of received signal frequency.

To achieve the above-mentioned objects, the autodyne receiver according to the present invention comprises (a) a plurality of linked tuning circuits connected in a high frequency signal line of the receiver for tuning a high frequency signal in of said plural tuning circuits; (b) a negative impedance converter connected to at least one of said tuning circuits for cancelling out a resistance included in said tuning circuit to which said negative impedance converter is connected to increase a tuning sharpness of said tuning circuit; and (c) a detector connected to said negative impedance converter in the high frequency signal line of the receiver for outputting a demodulated signal.

In the autodyne receiver according to the present invention, since the resistance of the tuning circuit can be cancelled by the negative impedance converter, the tuning sharpness of the tuning circuit connected to the negative impedance converter can be improved. Therefore, it is possible to use a stable tuning circuit having a low sharpness without applying a positive feedback signal. The gain of the negative impedance converter is constant irrespective of signal frequency and the tuning sharpness increases in proportion to a received signal frequency. In other words, it is possible to realize an autodyne receiver having a high constant selectivity irrespective of received signal frequency.

BRIEF DESCRIPTION OF THE DRAWINGS

The features and advantages of the autodyne receiver according to the present invention will be more clearly appreciated from the following description of the preferred embodiment of the invention taken in conjunction with the accompanying drawings in which.

DETAILED DESCRIPTION OF THE PREFERRED EMBODIMENTS

An embodiment of the autodyne receiver according to the present invention will be described with reference to the attached drawings.

Figure 1:
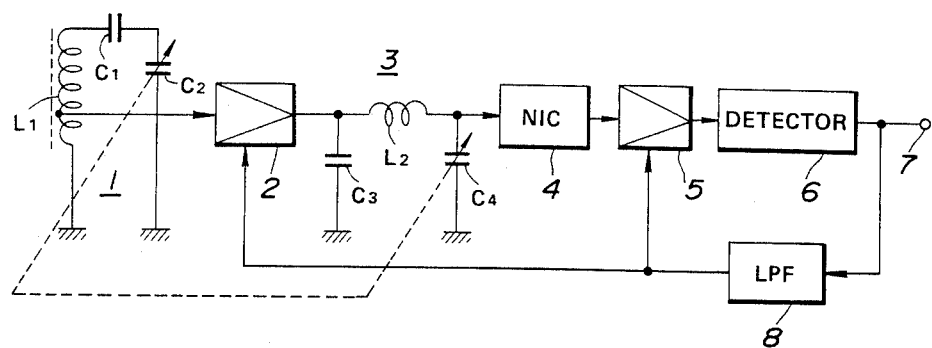
FIG. 1 is a schematic block diagram showing an embodiment of an autodyne receiver according to the present invention.

As shown in FIG. 1, an autodyne receiver according to the invention is roughly made up of an antenna tuning circuit 1, a first high frequency amplifier 2, an interstage tuning circuit 3, a negative impedance converter 4, a second high frequency amplifier 5, a detector 6, and a low-pass filter 8, connected to receive and amplify signals within a predetermined frequency range.

In the antenna tuning circuit 1, two series-connected capacitive impedances, i.e. a capacitor $C_1$ and a variable capacitor $C_2$, are series-connected and in parallel with a bar antenna coil $L_1$. An intermediate tap is provided for the coil $L_1$ to obtain a tuned output signal from the antenna tuning circuit 1. In this embodiment, the tuning sharpness Q of the antenna tuning circuit 1 is moderate to such an extent that a sufficiently high stability can be obtained, for instance, as Q=100 for the circuit shown. The capacitance of the capacitor $C_1$ is much greater than that of $C_2$, i.e. $C_1 >> C_2$.

The tuned output signal obtained by the antenna tuning circuit 1 is applied to the high frequency amplifier 2 having a sufficiently high output impedance. The interstage tuning circuit 3 is connected to the high output impedance terminal of the amplifier 2. The interstage tuning circuit 3 is composed of a coil $L_2$, a capacitor $C_3$ and a variable capacitor $C_4$ (where $C_3 >> C_4$), which have the same values as those of the components $L_1$, $C_1$ and $C_2$ of the bar antenna tuning circuit 1, respectively, and which are connected in the form of $\pi$. Further, the variable capacitor $C_4$ is mechanically linked for adjustment with the variable capacitor $C_2$ of the antenna tuning circuit 1. Thus, an adjustment of the capacitor $C_2$ also modifies the value of the capacitor $C_4$. The sharpness Q of the tuning circuit 3 is moderately high enough without deteriorating the stability of the tuning circuit 3.

Figure 2:
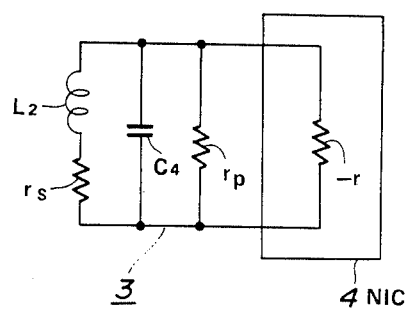
FIG. 2 is an equivalent circuit diagram showing a tuning circuit and a negative impedance converter connected to the tuning circuit, both of which are incorporated in the autodyne receiver shown in FIG. 1.

In accordance with a main feature of the invention, a negative impedance converter 4 is connected to the output terminal of the tuning circuit 3. Although one example of this converter 4 will be described later, the input impedance of this converter 4 has a negative resistance of $-r$. That is, since the output impedance of the amplifier 2 is sufficiently high and further $C_3$ is much greater than $C_4$ in capacitance, the equivalent circuit of the tuning circuit 3 can be shown as in FIG. 2, where $r_s$ denotes an equivalent series-resistance of the coil $L_2$ and $r_p$ denotes an equivalent parallel-resistance of both of the circuits 3 and 4.

The negative resistance $-r$ of the negative impedance circuit 4 is determined irrespective of the signal frequency as follows:

$$|-r| = r_p \qquad (1)$$

Further, the converter 4 is so designed as to be an amplifier having a constant gain for the input signal (when seen from the output terminal) irrespective of the signal frequency.

The output of the converter 4 is supplied through a high frequency amplifier 5 to a detector 6 for outputting a demodulated signal to the next stage. The detected output thereof is connected to an output terminal 7 and a lowpass filter 8 to supply an AGC (automatic gain control) voltage signal to the amplifiers 2 and 5.

In the circuit configuration as described above, a signal is received by the bar antenna coil $L_1$. A signal of a frequency required to be received is selected from the received high frequency signal through the antenna tuning circuit to some extent, and the received and selected signal is supplied through the amplifier 2 to the tuning circuit 3 for further selection of the signals. The received signal, which has been selected twice, is supplied through the negative impedance converter 4 and the amplifier 5 to the detector 6 and a demodulated audio signal is obtained from the output terminal 7. Further, an automatic gain control is achieved for the amplifiers 2 and 5 on the basis of an AGC voltage signal applied through the lowpass filter 8.

In this embodiment, even if the sharpness Q of the tuning circuit 3 itself is small, since the negative impedance converter 4 is connected to the succeeding stage to cancel out the equivalent parallel resistance $r_p$ of the tuning circuit 3 on the basis of the negative resistance $-r$, it is possible to substantially increase the resultant tuning sharpness Q of the tuning circuit 3 and the negative impedance converter 4 by a factor which is n times (where $n > 1$) higher than that of the tuning circuit 3. For example, Q=250. This is because in a tuning circuit or a resonance circuit, the lower the resistance the higher the sharpness Q in the resonance characteristics. Here, if the sharpness Q of the antenna tuning circuit 1 is Q=100, the overall sharpness Q from the antenna 1 to the converter 4 can be increased to as high as Q=1000. This is because since Q=100 corresponds to 6 dB and Q=250 corresponds to 14 dB, an additional 20 dB of both in decibels corresponds roughly to Q=1000. Therefore, it is possible to obtain a high tuning sharpness equivalent to that of a superheterodyne receiver.

Further, in this embodiment, since the equivalent parallel resistance $r_p$ of the tuning circuit 3 is cancelled by the negative resistance $-r$ of the negative impedance converter 4, the resultant sharpness Q of the two circuits 3 and 4 can be expressed as $$Q = 2\pi f o L_2 / r_s \qquad (2)$$

Therefore, the sharpness Q increases in proportion to the received frequency fo. Further, if the sharpness Q is proportional to frequency fo as already shown by $Q = fo/\Delta f$, the bandwidth $\Delta f$ is constant as follows by substituting $Q = fo/\Delta f$ into expression (2) above:

$$f = r_s / 2\pi L_2$$

The above expression indicates that the resultant selectivity of the two circuits 3 and 4 is constant irrespective of the received frequency and therefore the selectivity of the whole receiver is roughly constant irrespective of the received frequency.

Further, since a necessary high sharpness Q can be obtained collectively by two tuning circuits 1 and 3, an excessively high sharpness Q is not required for each tuning circuit 1 and 3, respectively. Thus it is possible to operate the tuning circuits 1 and 3 in sufficiently stable conditions. In the tuning circuit 3, in particular, since the sharpness Q can be increased by means of the negative impedance converter 4 to such a moderate extent as Q=250, it is possible to use a sufficiently stable tuning circuit as the tuning circuit 3.

Further, since the received signal is amplified by the amplifiers 2 and 5, respectively, and further by the converter 4 under sufficiently stable conditions, it is also possible to obtain a sufficient gain, thus allowing the receiver to be highly sensitive.

Further, since the resultant gain A of the amplifier 2 and the tuning circuit 3 can be expressed as $$A + g_m \frac{L_2}{(C_3 + C_4)r_s} \doteq g_m \frac{L_2}{C_3 r_s} \quad (\because C_3 >> C_4) \quad (3)$$

where $g_m$ is the mutual conductance of the amplifier 2, the gain is constant irrespective of the received signal frequency. Accordingly, a stable operation is obtainable from this point of view.

Additionally, it is possible to achieve a sufficient automatic gain control because a sufficient gain can be obtained and a stable operation can be achieved.

Figure 3:
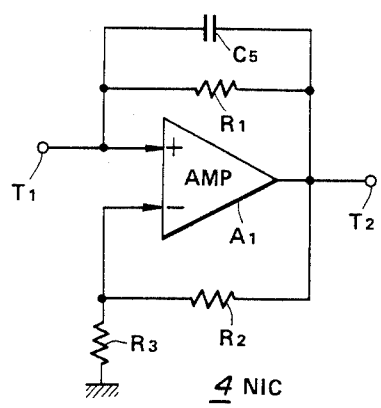
FIG. 3 is a circuit diagram showing an example of the negative impedance converter shown in FIG. 1.
Figure 4:
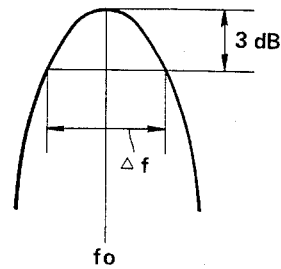
FIG. 4 is a diagram for assistance in explaining the selectivity of a tuning circuit.

FIG. 3 shows an exemplary circuit configuration of the negative impedance converter 4. In this drawing, the converter 4 is composed of an operational amplifier $A_1$ having a sufficiently large gain. A capacitor $C_5$ and a resistor $R_1$ are both connected in parallel between the non-inversion input terminal and the output terminal of the operational amplifier $A_1$. A resistor $R_2$ is connected between the inversion input terminal and the output terminal thereof. A resistor $R_3$ is connected between the non-inversion input terminal and a source of reference potential, such as ground. Further, an input terminal $T_1$ is connected to the non-inversion input of the operational amplifier $A_1$, and an output terminal $T_2$ is connected to the output thereof, respectively.

The gain A between the input and output terminals $T_1$ and $T_2$ can be expressed as $$A = \frac{A_0}{1 + jw/w_c} \quad (4)$$

$$A_0 = 1 + (R_2/R_3)$$

where w is the angular frequency of the signal, and $w_c$ is the cut-off frequency when the amplifier $A_1$ is used in a closed loop fashion.

Therefore, when seen from the terminal $T_1$, the input admittance Yi is $$Y_i + G_1 \left( 1 - \frac{A_0}{1 + (w/w_c)^2} \left( 1 + \frac{w}{w_c} wC_5R_1 \right) \right) + \quad (5)$$

$$j\left( wC_5 - \frac{A_0}{1 + (w/w_c)^2} \left( wC_5 - \frac{w}{w_c} G_1 \right) \right)$$

where
$$G_1 = 1/R_1$$

If $w_f = 1/(C_5 R_1)$
the above expression (5) can be expressed as $$Y_i + G_1 \left( 1 - \frac{A_0}{1 + (w/w_c)^2} \left( 1 + \frac{w^2}{w_c w_f} \right) \right) + \quad (6)$$

$$j\left( wC_1 - \frac{A_0}{1 + (w/w_c)^2} \left( wC_1 - \frac{w}{w_c} G_1 \right) \right)$$

the above expression (6) is $$Gi = G_1 (1 - A_0) \quad (7)$$

Further, since $A_0 > 1$ in general, the input admittance Gi is negative, and the angular frequency w is not included in the above expression (7).

Therefore, when the amplifier $A_1$ is seen from the input terminal $T_1$, it is possible to obtain a negative resistance having a constant magnitude irrespective of the signal frequency.

Further, the amplifier $A_1$ operates as a feedback amplifier having a gain $A_0$ with respect to the input signal thereto.

As described above, the autodyne receiver according to the present invention has the following various advantages:

(1) A sufficiently high tuning sharpness Q or selectivity can be obtained on the basis of plural tuning circuits 1 and 3. Since an excessively high sharpness Q is not required for each tuning circuit, the two tuning circuits are stable in operation. In particular, since it is unnecessary to apply a positive feedback signal to the tuning circuit 3 and the sharpness Q is moderate enough to such an extent as Q=250 by the aid of the negative impedance converter 4, the tuning circuit 3 can operate sufficiently stablely.

(2) Since the resultant sharpness Q of the tuning circuit 3 and the negative impedance converter 4 increases with increasing received frequency, the resultant bandwidth Δf is constant regardless of the received frequency; that is, the selectivity is constant regardless of the received frequency.

(3) Since the received signal is amplified by the two amplifiers 2 and 5 and additionally by the negative impedance converter 4, the gain is sufficiently high and the sensitivity is thus increased.

(4) Since the resultant gain A of the amplifier 2 and the tuning circuit 3 is constant as shown by the expression (3) regardless of the received signal frequency, the receiver is sufficiently stable in operation, thus permitting a sufficiently stable automatic gain control of the receiver.

While the present invention has been disclosed in terms of the preferred embodiment of the invention in order to facilitate a full understanding of the invention, it should be appreciated that the present invention should not be limited to the specific embodiment illustrated above. Various embodiments and modifications of the shown embodiment are possible. Therefore, the present invention should be understood as including all possible embodiments and modifications which do not depart from the principles of the invention set forth in the appended claims.

What is claimed is:
1. An autodyne receiver comprising:
 (a) a plurality of tuning circuits connected in a high frequency signal line of the receiver, at least two of said tuning circuits being cooperative for tuning a high frequency signal;

(b) a negative impedance converter connected to at least one of said two tuning circuits for cancelling out a resistance included in said tuning circuit, to which said negative impedance converter is connected, to increase a tuning sharpness of said tuning circuit; and (c) a detector connected to said negative impedance converter in the high frequency signal line of the receiver for outputting a demodulated signal.

2. An autodyne receiver comprising:

(A) a plurality of linked tuning circuits connected in a high frequency signal line of the receiver for tuning a high frequency signal with said plural tuning circuits:

(B) a negative impedance converter connected to at least one of said tuning circuits for cancelling out a resistance included in said tuning circuit, to which said negative impedance converter is connected, to increase a tuning sharpness of said tuning circuit, said negative impedance converter including:

(a) an operational amplifier having a non-inversion input terminal, an inversion input terminal, and an output terminal;

(b) parallel-connected resistor and capacitor connected between said non-inversion input terminal and said output terminal;

(c) a first resistor connected between said inversion input terminal and said output terminal;

(d) a second resistor connected between said inversion input terminal and ground; and (C) a detector connected to said negative impedance converter in the high frequency signal line of the receiver for outputting a demodulated signal.

3. The autodyne receiver as set forth in claim 1, wherein said negative impedance converter has a constant gain with respect to signals inputted thereto irrespective of signal frequencies.

4. The autodyne receiver as set forth in claim 1, wherein said negative impedance converter cancels the resistance of said tuning circuit to which said negative impedance converter is connected in such a way that the tuning sharpness of said tuning circuit increase in proportion to the received and tuned signal frequency.

5. The autodyne receiver as set forth in claim 1, wherein said negative impedance converter cancels the resistance of said tuning circuit to which said negative impedance converter is connected in such a way that the selectivity of said tuning circuit is constant irrespective of the received and tuned signal frequency.

6. An autodyne receiver including a plurality of linked tuning circuits for tuning a high frequency signal in said plural tuning circuits, characterized in that a negative impedance converter is connected to at least one of said tuning circuits to cancel out a resistance of said tuning circuit, to which said converter is connected, for increasing a tuning sharpness of said tuning circuit.

7. The autodyne receiver as set forth in claim 6, wherein said negative impedance converter is connected to at least one of said tuning circuits in such a way that gain of said tuning circuit to which said converter is connected is constant irrespective of signal frequencies and the tuning sharpness of said tuning circuit increases in proportion to the signal frequency.

8. In a tuned receiver of a type which comprises an antenna tuning circuit and an interstage tuning circuit each having at least one capacitive impedance linked to an associated capacitive impedance of the other, and a detector for receiving tuned frequency signals to produce a demodulated output signal thereof, the improvement comprising:

negative impedance conversion means in circuit with one of said tuning circuits prior to said detector means, said negative impedance conversion means exhibiting a negative resistance sufficient to cancel the equivalent resistance of the tuning circuit to which said negative impedance conversion means is connected, to substantially increase the resultant tuning sharpness Q of said tuning circuit.

9. The improvement as set forth in claim 8, wherein said negative impedance conversion means is further characterized as exhibiting a negative resistance which is about equal to the equivalent parallel resistance of the tuning circuit to which it is connected.

10. An autodyne receiver, of a type which comprises an antenna tuning circuit and an interstage tuning circuit each having at least one capacitive impedance linked to an associated capacitive impedance of the other, and a detector for receiving tuned frequency signals to produce a demodulated output signal thereof, the improvement comprising:

(a) negative impedance conversion means in circuit with one of said tuning circuits prior to said detector means, said negative impedance conversion means exhibiting a negative resistance sufficient to cancel the equivalent resistance of the sharpness Q of said tuning circuit, said conversion means including an operational amplifier having a resistor and a capacitor connected between a non-inversion input terminal and an output terminal of said operational amplifier, a second resistor connected between an inversion input terminal and the output terminal of said output amplifier, and a third resistor connected between said inversion input terminal of said operational amplifier and a source of reference potential.

11. The improvement as set forth in claim 8, wherein the combination is characterized in that the sharpness Q exhibited by the combination of the tuning circuits and the negative impedance conversion means increases in proportion to the received frequency.

12. The improvement as set forth in claim 11, wherein said combination exhibits a constant resultant selectivity of the tuning circuits irrespective of the received frequency so that the selectivity of the receiver is approximately constant irrespective of the received frequency.

13. An autodyne receiver comprising:

a first tuning circuit means connected in a high frequency signal line of the receiver for tuning a high frequency signal therewith;

a second tuning circuit means connected in a high frequency signal line of the receiver for tuning a high frequency signal therewith, and cooperated with said first tuning circuit means, said second tuning circuit means having a negative impedance value different from that of said first tuning circuit so that tuning sharpness of the combined tuning circuit means composed of said first and second tuning circuit means is increased; and a detector means connected to one of said first and second tuning circuit means for outputting a demodulated signal.

14. An autodyne receiver comprising:

(a) a plurality of linked tuning circuits connected in a high frequency signal line of the receiver for tuning a high frequency signal with said plural tuning circuits;

(b) a negative impedance converter connected to at least one of said tuning circuits for cancelling out a resistance included in said tuning circuit, to which said negative impedance converter is connected, to increase a tuning sharpness of said tuning circuit, said negative impedance converter including an operational amplifier having a resistor and a capacitor connected between a non-inversion input terminal and an output terminal of said operational amplifier, a second resistor connected between an inversion input terminal of said operational amplifier and a source of reference potential; and (c) a detector connected to said negative impedance converter in the high frequency signal line of the receiver for outputting a demodulated signal.

* * * * *